(12) United States Patent
Li

(10) Patent No.: US 7,777,579 B2
(45) Date of Patent: Aug. 17, 2010

(54) LOCAL OSCILLATION GENERATOR WITH MIXER HAVING REDUCED SIGNAL POWER CONSUMPTION

(75) Inventor: Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 743 days.

(21) Appl. No.: 11/647,884

(22) Filed: Dec. 29, 2006

(65) Prior Publication Data

US 2008/0157883 A1  Jul. 3, 2008

(51) Int. Cl.
*H03B 19/00* (2006.01)
*H03B 21/00* (2006.01)
(52) U.S. Cl. .................. 331/40; 331/42; 327/113; 455/333
(58) Field of Classification Search .......... 331/37, 331/40, 42, 43; 327/113; 455/313, 323, 455/333
See application file for complete search history.

(56) References Cited

U.S. PATENT DOCUMENTS 6,591,093 B1 * 7/2003 Coffing et al. .............. 455/319

* cited by examiner

*Primary Examiner*—David Mis
(74) *Attorney, Agent, or Firm*—Farjami & Farjami LLP

(57) ABSTRACT

According to one exemplary embodiment, a local oscillation generator includes a mixing stage for receiving a primary frequency and one of a number of related frequencies. The local oscillation generator further includes a first transconductance stage to provide a first related frequency to the mixing stage when a first switch selectably enables a first power path in the first transconductance stage. The local oscillation generator further includes a second transconductance stage to provide a second related frequency to the mixing stage when a second switch selectably enables a second power path in the second transconductance stage. The local oscillation generator further includes a number of dividers, where an output of a first divider provides the first related frequency to an input of the first transconductance stage, and where an output of a second divider provides the second related frequency to an input of the second transconductance stage.

18 Claims, 4 Drawing Sheets

US 7,777,579 B2

LOCAL OSCILLATION GENERATOR WITH MIXER HAVING REDUCED SIGNAL POWER CONSUMPTION

BACKGROUND OF THE INVENTION

1. Field of the Invention

The present invention is generally in the field of electrical circuits. More particularly, the invention is in the field of oscillators and mixers.

2. Background Art

Wireless communications devices, such as cell phones, wireless LANs, and satellite set top boxes, typically utilize a "local oscillation generator" (also referred to simply as a "local oscillation generator" in the present application) to provide different frequencies as required for operation on desired communication channels. For example, the local oscillation generator can provide an output signal having a reference frequency to respective transmitter and receiver sections of a wireless communication device for upconversion and downconversion of an input frequency. The local oscillation generator can generate an output signal having a desired reference frequency by combining a signal having a primary frequency with a signal having an appropriately divided frequency in a mixing stage of the local oscillation generator.

In a conventional local oscillation generator, a signal having a divided frequency can be generated and provided to the mixing stage by utilizing switches to selectively route the primary frequency signal through one or more frequency dividers. Thus, typically in the conventional local oscillation generator, the path of the signal having the divided frequency passes through one or more such switches. However, parasitic capacitor and resistance in typical switches can undesirably cause signal loss, which is particularly undesirable for local oscillation generators used in mobile wireless communication devices, such as cell phones.

SUMMARY OF THE INVENTION

A local oscillation generator with mixer having reduced signal power consumption substantially as shown in and/or described in connection with at least one of the figures, as set forth more completely in the claims.

DETAILED DESCRIPTION OF THE INVENTION

The present invention is directed to a local oscillation generator with mixer having reduced signal power consumption. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention provides an innovative local oscillation generator with mixer for providing a desired output frequency with reduced signal power consumption. Although only two dividers are utilized in the present application for ease of illustration of the inventive concepts, the present invention's local oscillation generator is not in any manner limited to two dividers, and the invention manifestly applies to more than two dividers to provide a larger selection of output frequencies.

Figure 1:
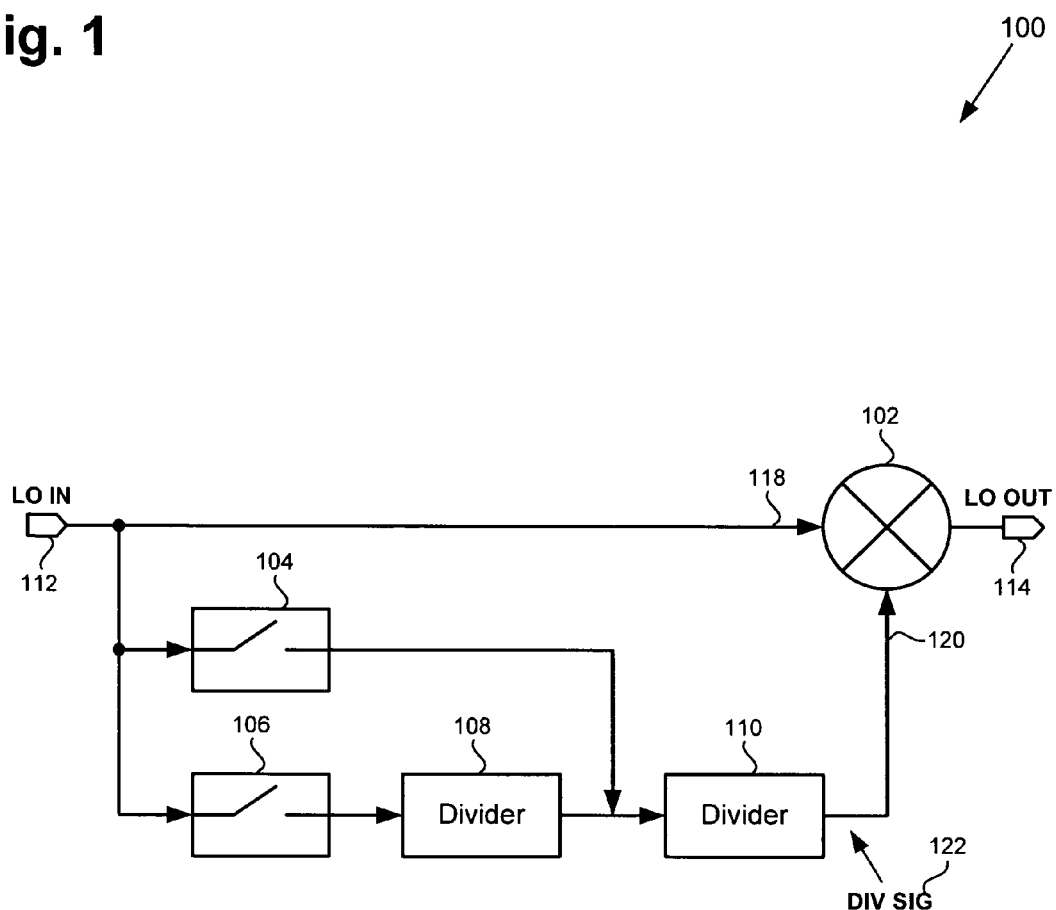
FIG. 1 is a block diagram of an exemplary conventional local oscillation generator.

FIG. 1 shows a block diagram of conventional local oscillation generator 100. Conventional local oscillation generator 100 includes mixer 102, switches 104 and 106, and frequency dividers 108 and 110 (also referred to simply as "dividers" in the present application). Conventional local oscillation generator 100 can receive local oscillation generator input signal (LO IN) 112, which can comprise differential signals, i.e., a differential pair, at a certain frequency (Fvco), and can generate local oscillation generator output signal (LO OUT) 114 with a desired output frequency (also referred to as a "selectable output frequency" in the present application). For example, LO IN 112 can be provided by a voltage controlled oscillator (VCO) in a phase locked loop. Conventional local oscillation generator 100 can be utilized in a wireless communications device, such as a cell phone, wireless LAN, or satellite set top boxes, for example. It is noted that although each signal line in FIG. 1 is shown as a single line for ease of illustration, each signal line in FIG. 1, such as signal lines for inputs 118 and 120 of mixer 102, can comprise two lines (i.e. a differential pair) to accommodate differential signals.

As shown in FIG. 1, LO IN 112 is coupled to input 118 of mixer 102 and first terminals of switches 104 and 106. Also shown in FIG. 1, a second terminal of switch 104 is coupled to the input of divider 110, a second terminal of switch 106 is coupled to the input of divider 108, the output of divider 108 is coupled to the input of divider 110, and the output of divider 110 is coupled to input 120 of mixer 102. Switches 104 and 106 can each be implemented by one or more transistors, such as a field effect transistors (FETs), for example. Dividers 108 and 110 can each be a divide-by-two frequency divider, for example. Divider 108 can be configured to receive LO IN 112 when switch 106 is closed and to provide an output signal to divider 110 having a frequency (F1) equal to 0.5Fvco.

Divider 110 can be configured to receive LO IN 112 when switch 104 is closed and switch 106 is open and to provide divider output signal (DIV SIG) 122 to input 120 of mixer 102 having a frequency (F2) equal to 0.5Fvco. Divider 110 can be further configured to receive an input signal from divider 108 having a frequency equal to 0.5Fvco when switch 104 is open and switch 106 is closed and to provide divider output signal (DIV SIG) 122 to input 120 of mixer 102 having a frequency equal to 0.25Fvco, since dividers 108 and 110 each divide Fvco, i.e., the frequency of LO IN 112, by 2.0.

Mixer 102 can be configured to receive LO IN 112 at input 118 and DIV SIG 122 at input 120, to combine the two input signals, i.e., LO IN 112 and DIV SIG 122, by addition and subtraction, and to generate signals having respective frequencies equal to Fvco+F2 and Fvco−F2, i.e., the sum and difference of the two input signals. As stated above, when switch 104 is closed and switch 106 is open, F2 can equal 0.5Fvco, and when switch 104 is open and switch 106 is closed, F2 can equal 0.25Fvco. In conventional local oscillation generator 100, either frequency Fvco+F2 or frequency Fvco–F2 can be filtered out and a signal having the remaining frequency can be outputted as LO OUT 114.

In conventional local oscillation generator 100, the signal path of DIV SIG 122 provided by divider 110 to input 120 of mixer 102 either passes through switch 104 if switch 104 is closed and switch 106 is open or passes through switch 106 if switch 106 is closed and switch 104 is open. When switches 104 and 106 are each implemented utilizing transistors, each switch can have parasitic capacitance, such as gate-to-drain parasitic capacitance and/or gate-to-source parasitic capacitance, and parasitic resistance. Since the closed switch, e.g., either switch 104 or switch 106, is in the signal path of DIV SIG 122, the parasitic capacitance and resistance of the closed switch can cause an undesirable power and signal loss in DIV SIG 122. Additionally, switches 104 and 106 are each required to handle LO IN 112, which can have a high frequency. As a result, switches 104 and 106 can undesirably increase signal loss and signal power consumption of conventional local oscillation generator 100.

Figure 2:
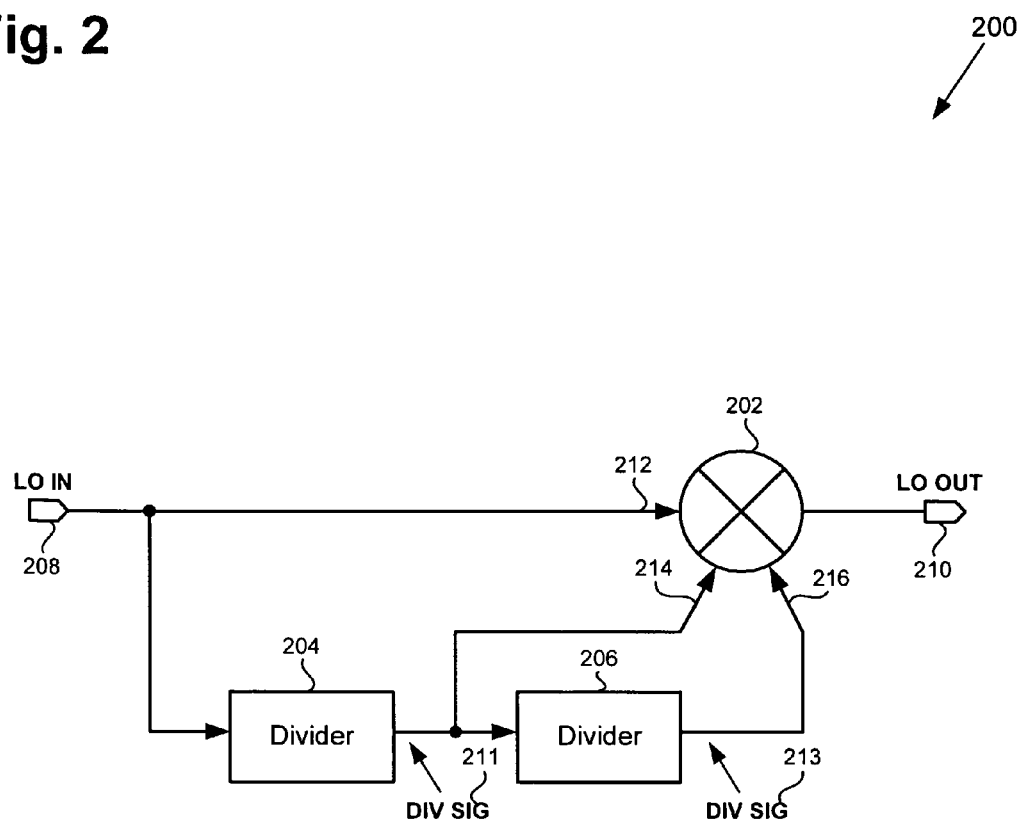
FIG. 2 is a block diagram of an exemplary local oscillation generator in accordance with one embodiment of the present invention.

FIG. 2 shows a block diagram of local oscillation generator 200 in accordance with one embodiment of the present invention. Local oscillation generator 200 includes mixer 202 and frequency dividers 204 and 206 (also referred to simply as "dividers" in the present application). Local oscillation generator 200 can receive local oscillation generator input signal (LO IN) 208, at a given frequency (Fvco) (also referred to as a "primary frequency" in the present application), and generate local oscillation generator output signal (LO OUT) 210 with a desired output frequency (Fout) (also referred to as a "selectable output frequency" in the present application). Although shown as a single line in FIG. 2, LO IN 208 can be a differential pair of signals. In another embodiment, LO IN 208 can be a single-ended signal instead of a differential pair. LO IN 208 can be generated by a voltage controlled oscillator (VCO) in a phase locked loop (PLL), for example. Local oscillation generator 200 can be utilized in a wireless communications device, such as a cell phone, wireless LAN, or satellite set top box, for example. As known in the art, local oscillation generator 200 can be fabricated on a single semiconductor die, for example. It is noted that although each signal line in FIG. 2 is shown as a single line for ease of illustration, each signal line in FIG. 2, such as signal lines for inputs 212, 214, and 216 of mixer 202, can comprise two lines (i.e. a differential pair) to accommodate differential signals.

As shown in FIG. 2, LO IN 208 is coupled to input 212 of mixer 202 and an input of divider 204. Divider output signal (DIV SIG) 211, which is outputted by divider 204, is coupled to input 214 of mixer 202 and the input of divider 206. DIV SIG 213, which is outputted by divider 206, is coupled to input 216 of mixer 202. DIV SIG 211 and DIV SIG 213 each have a frequency that is related to the frequency at LO IN 208, for example, by a divide factor of two, four, etc., and is each generally also referred to as a signal with a "related frequency" in the present application. In the present embodiment, dividers 204 and 206 can each be a divide-by-two frequency divider. In another embodiment, dividers 204 and 206 can each divide the frequency of their respective input signals by a factor of "$2^N$," where "N" is the number of "divide-by-two"s in series, and where N is a number other than one. Thus, in the present embodiment, DIV SIG 211 can have a frequency (F1) equal to 0.5Fvco, since DIV SIG 211 is provided by passing LO IN 208 through divider 204, and DIV SIG 213 can have a frequency (F2) equal to 0.25Fvco, since DIV SIG 213 is provided by passing DIV SIG 211 through divider 206.

Mixer 202 can be configured to receive LO IN 208 at input 212, DIV SIG 211 at input 214, and DIV SIG 213 at input 216. In the present embodiment, mixer 202 selects either DIV SIG 211 or DIV SIG 213, and combines the selected divider output signal with LO IN 208. The result at mixer output LO OUT 210 will be signals having frequencies equal to the sum and difference of Fvco, i.e. the frequency of LO IN 208, and either F1 (if DIV SIG 211 is selected) or F2 (if DIV SIG 213 is selected). In other words, the result at mixer output LO OUT 210 will be either the frequency pair Fvco+F1 and Fvco–F1, or the frequency pair Fvco+F2 and Fvco–F2. Mixer 202 can be further configured to filter out either the sum or difference signal and output only one frequency at LO OUT 210. For example, mixer 202 can be configured to output only Fvco+F1 or only Fvco+F2.

In the present embodiment, either DIV SIG 211 or DIV SIG 213 can be selected to be combined with LO IN 208 in mixer 202 by selectably enabling a power path (for example, a ground path) in a corresponding transconductance (Gm) stage (not shown in FIG. 2) in mixer 202. Thus, in contrast to conventional local oscillation generator 100 in FIG. 1, the invention's local oscillation generator selects a divider output signal to combine with LO IN 208 by enabling a power path for a corresponding transconductance stage of the mixer, thereby avoiding an undesirable reduction in signal power that can result from switches in the signal paths of selected mixer input signals. By reducing signal power loss, the invention's local oscillation generator advantageously achieves improved signal levels and a reduced power consumption compared to conventional local oscillation generator 100.

In the present embodiment, divider 206, which is coupled to the output of divider 204, can be designed to handle only ½ of Fvco, i.e. ½ of the frequency of LO IN 208. Thus, divider 206 does not have to be designed to handle as high of a frequency as divider 204, since divider 204 needs to be designed to handle the undivided frequency of LO IN 208. Thus, since a higher frequency divider typically consumes more power than a lower frequency divider, the lower frequency requirement of divider 206 results in decreased power consumption in the invention's local oscillation generator 200. In contrast, dividers 108 and 110 in conventional local oscillation generator 100 each have to be designed to handle the undivided input frequency, i.e., Fvco, of LO IN 112. Thus, the invention's local oscillation generator achieves a further reduction in power consumption compared to conventional local oscillation generator 100. Mixer 202 will be further discussed below in relation to FIG. 3.

Figure 3:
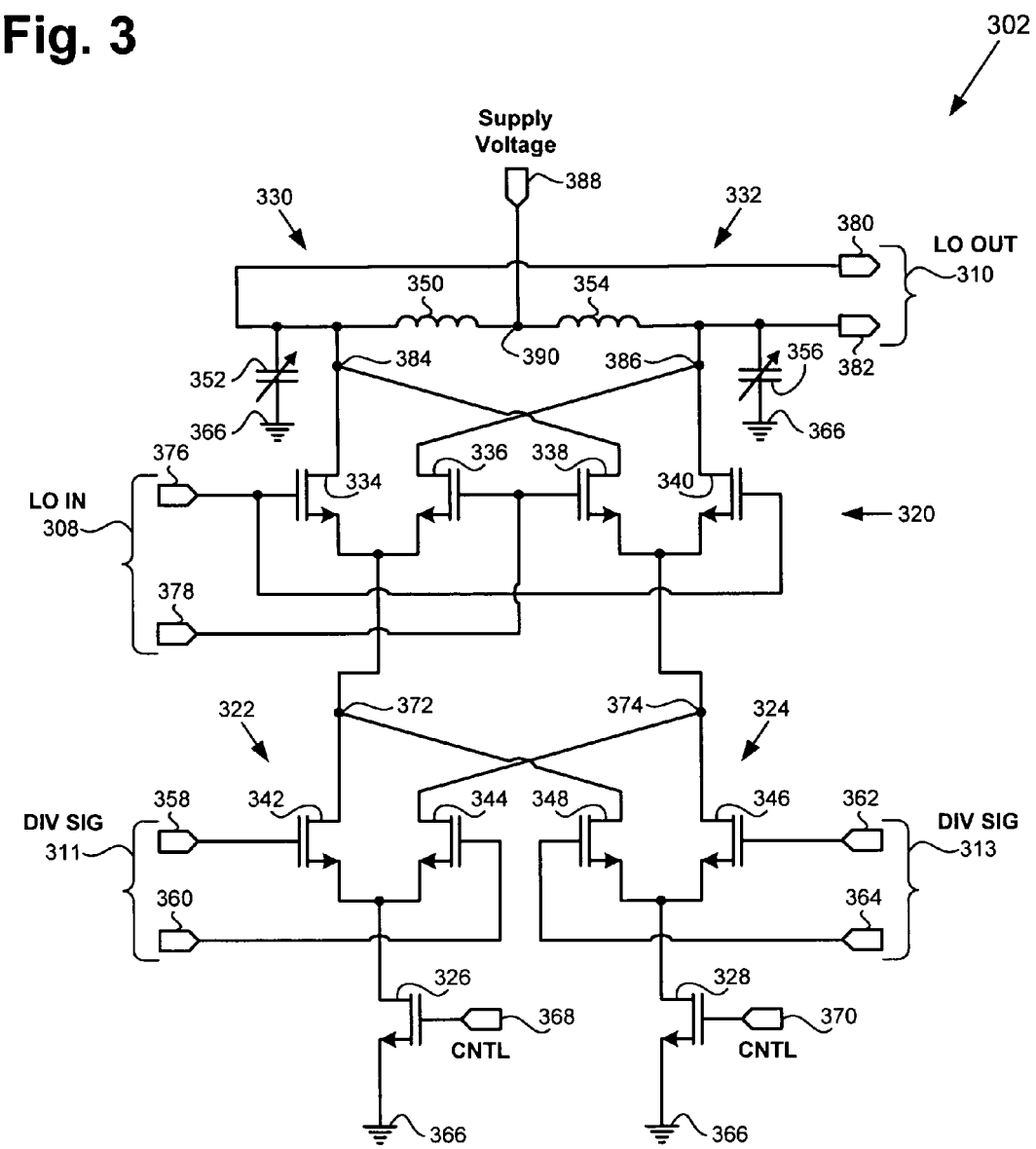
FIG. 3 is a circuit diagram of an exemplary mixer in the exemplary local oscillation generator of FIG. 2.

FIG. 3 shows a circuit diagram of mixer 302 according to one embodiment of the present invention. Mixer 302 in FIG. 3 corresponds to mixer 202 in local oscillation generator 200 in FIG. 2. Also, LO IN 308, LO OUT 310, DIV SIG 311, and DIV SIG 313 in FIG. 3 correspond, respectively, to LO IN 208, LO OUT 210, DIV SIG 211, and DIV SIG 213 in FIG. 2. Mixer 302 includes mixing stage 320, transconductance stages 322 and 324, exemplary select switches 326 and 328, and filters 330 and 332. Mixing stage 320 includes transistors 334, 336, 338, and 340, transconductance stage 322 includes transistors 342 and 344, transconductance stage 324 includes transistors 346 and 348, filter 330 includes inductor 350 and variable capacitor 352, and filter 332 includes inductor 354 and variable capacitor 356. Although a mixer, i.e., mixer 302, having only two transconductance stages, i.e., transconductance stages 322 and 324, is shown to simplify discussion of the present invention, it is understood by those of ordinary skill in the art that the mixer in the invention's local oscillation generator can manifestly include more than two transconductance stages.

As shown in FIG. 3, DIV SIG 311, which has frequency F1, includes differential signals 358 and 360, which are coupled to the differential inputs of transconductance stage 322, i.e. the respective gates of transistors 342 and 344. Differential signals 358 and 360 each have the same frequency, i.e. F1, but are 180.0 degrees out of phase. Also shown in FIG. 3, DIV SIG 313, which has frequency F2, includes differential signals 362 and 364, which are coupled to the differential inputs of transconductance stage 324, i.e. the respective gates of transistors 346 and 348. Differential signals 362 and 364 each have the same frequency, i.e. F2, but are 180.0 degrees out of phase. Transistors 342, 344, 346, and 348 can each have substantially the same Gm (transconductance) and can each be an NFET, for example. In another embodiment, transconductance stages, such as transconductance stages 322 and 324, may be implemented using different types of transistors.

Further shown in FIG. 3, the drain of transistor 326 is coupled to the sources of transistors 342 and 344, the source of transistor 326 is coupled to ground 366, and the gate of transistor 326 is coupled to control signal (CNTL) 368. Also shown in FIG. 3, the drain of transistor 328 is coupled to the sources of transistors 346 and 348, the source of transistor 328 is coupled to ground 366, and the gate of transistor 328 is coupled to CNTL 370. In the present embodiment, transistors 346 and 348, can each comprise an NFET, and are examples of switches that are utilized to enable ground paths (generally referred to as "power paths" in the present application) for respective transconductance stages 322 and 324. In another embodiment, power paths (for example ground paths) for the transconductance stages, such as transconductance stages 322 and 324, may be enabled by using different types of switches and/or transistors.

Further shown in FIG. 3, the drains of transistors 342 and 348 are coupled to one differential input of mixing stage 320 at node 372 and the drains of transistors 344 and 346 are coupled to another differential input of mixer at node 374. Also shown in FIG. 3, LO IN 308, which has frequency Fvco (also referred to as a "primary frequency" in the present application), includes differential signals 376 and 378. Further shown in FIG. 3, differential signal 376 is coupled to the gates of transistors 334 and 340, which form one differential input of mixing stage 320, and differential signal 378 is coupled to the gates of transistors 336 and 338, which form another differential input of mixing stage 320.

Further shown in FIG. 3, LO OUT 310, which has frequency Fout, includes differential output signals 380 and 382, which are driven respectively by nodes 384 and node 386 of mixing stage 320. Differential output signals 380 and 382 each have the same frequency, i.e. Fout, but are 180.0 degrees out of phase. Further shown in FIG. 3, supply voltage 388, which can be VDD, is coupled to first terminals of inductors 350 and 354 at node 390, while second terminals of inductors 350 and 354 are coupled to first terminals of respective variable capacitors 352 and 356, where second terminals of variable capacitors 352 and 356 are coupled to ground 366.

The operation of mixer 302 will now be discussed. LO IN 308, which has frequency Fvco, is applied to the differential inputs of mixing stage 320, while DIV SIG 311 and DIV SIG 313 are applied to the differential inputs of respective transconductance stages 322 and 324. In the present embodiment, LO IN 308 can be combined with either DIV SIG 311 or DIV SIG 313 in mixing stage 320 by selectably enabling a respective power path (i.e. a respective ground path in the present embodiment) for either transconductance stage 322 or transconductance stage 324. For example, DIV SIG 311 can be selected to be combined with LO IN 308 by enabling a switch to ground path, i.e. by causing CNTL 368 to go high to turn on transistor 326. In the present embodiment, when transistor 326 turns on, the switch formed by transistor 326 closes, thereby coupling the sources of transistors 342 and 348 to ground 366 to enable transconductance stage 322 by enabling the power path for transconductance stage 322. In a similar manner, DIV SIG 313 can be selected to be combined with LO IN 308 by turning on transistor 328 to enable a power path for transconductance stage 324.

In the above example, when transistor 326 is turned on to select DIV SIG 311, currents drawn through transistors 342 and 344 and the corresponding voltages generated at nodes 372 and 374 will correspond to the frequency of DIV SIG 311, thereby in effect coupling the frequency of DIV SIG 311 to mixing stage 320 and causing it to combine with the frequency present at differential inputs of mixing stage 320, i.e. Fvco. In other words, in mixing stage 320, DIV SIG 311, which has frequency F1, is combined with LO IN 308, which has frequency Fvco, to generate signals having respective frequencies Fvco−F1 and Fvco+F1 at nodes 384 and 386. Variable capacitors 352 and 356 in respective filters 330 and 332 can be appropriately adjusted to filter out either Fvco−F1 or Fvco+F1. For example, if Fvco−F1 is filtered out by filters 330 and 332, Fout, i.e. the frequency at differential output LO OUT 310, will be equal to Fvco+F1. Similarly, when DIV SIG 313, which has frequency F2, is selected by turning on transistor 328, signals having respective frequencies Fvco−F2 and Fvco+F2 are generated at nodes 384 and 386 in mixing stage 320. Variable capacitors 352 and 356 in respective filters 330 and 332 can then be appropriately adjusted to filter out either Fvco−F2 or Fvco+F2. For example, if Fvco−F2 is filtered out by filters 330 and 332, Fout, i.e. the frequency at differential output LO OUT 310, will be equal to Fvco+F2.

Thus, the invention achieves a local oscillation generator that utilizes switches to enable power paths for respective transconductance stages in mixer 302, thereby selecting a corresponding divided frequency (or generally, a frequency related to a primary frequency) to combine with the local oscillation generator input frequency (or generally, a primary frequency, e.g. Fvco) to achieve a desired local oscillation generator output frequency. In this manner the invention prevents signal power loss in switches that would otherwise be in signal paths (as is the case with conventional local oscillation generators), while also reducing overall power consumption.

Figure 4:
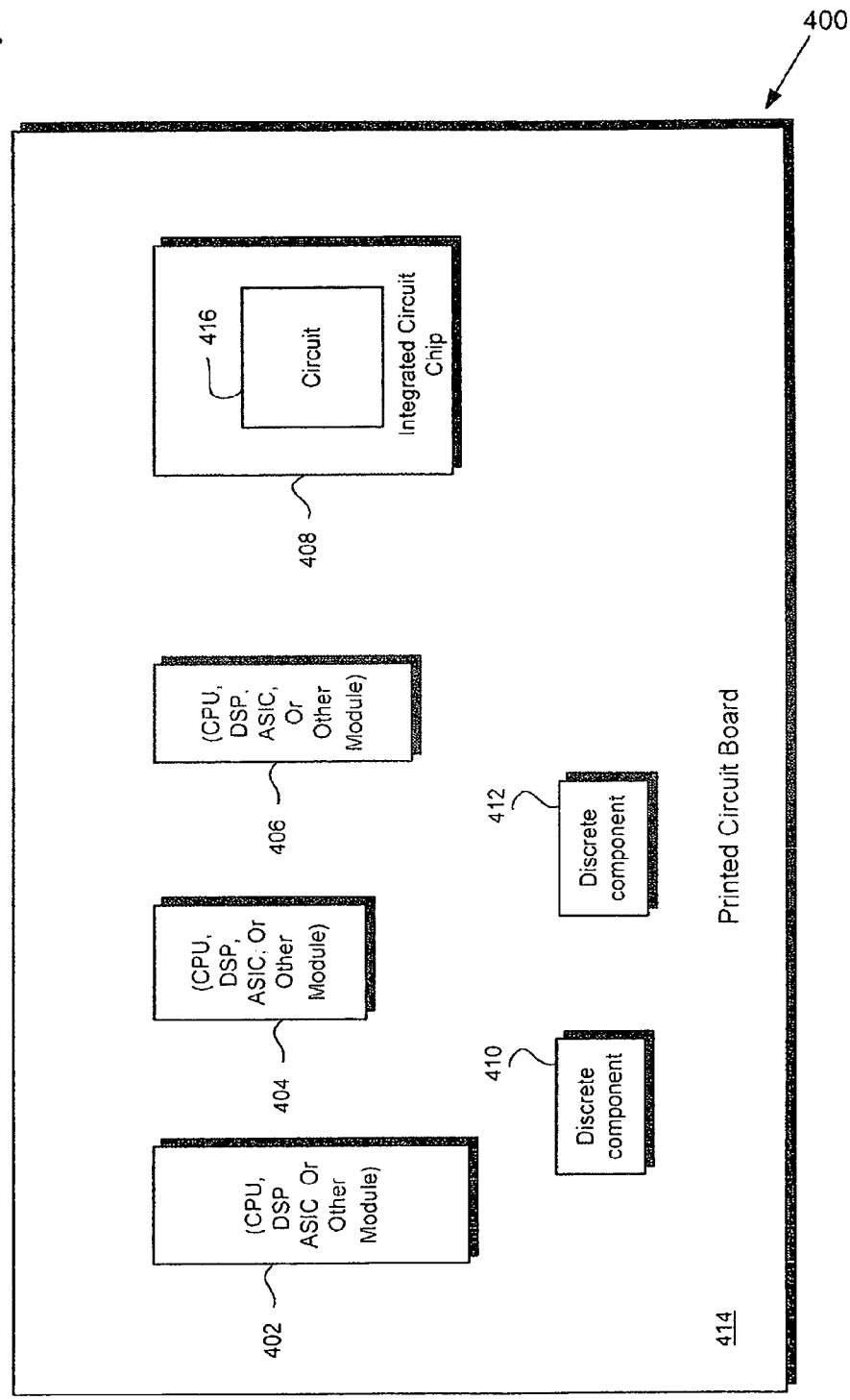
FIG. 4 is a diagram of an exemplary electronic system including an exemplary chip or die utilizing one or more local oscillation generators in accordance with one embodiment of the present invention.

FIG. 4 illustrates a diagram of an exemplary electronic system including an exemplary chip or die utilizing one or more local oscillation generators in accordance with one embodiment of the present invention. Electronic system 400 includes exemplary modules 402, 404, and 406, IC chip or semiconductor die 408, discrete components 410 and 412, residing in and interconnected through printed circuit board (PCB) 414. In one embodiment, electronic system 400 may include more than one PCB. IC chip 408 includes circuit 416, which can comprise one of the invention's local oscillation generators, such as local oscillation generator 200, including mixer 202 (or mixer 302), as described above.

As shown in FIG. 4, modules 402, 404, and 406 are mounted on PCB 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. PCB 414 can include a number of interconnect traces (not shown in FIG. 4) for interconnecting modules 402, 404, and 406, discrete components 410 and 412, and IC chip 408.

Also shown in FIG. 4, IC chip 408 is mounted on PCB 414 and can be, for example, any chip utilizing an embodiment of the invention's local oscillation generator. In one embodiment, IC chip 408 may not be mounted on PCB 414, and may be interconnected with other modules on different PCBs. As stated above, circuit 416 is situated in IC chip 408 and comprises an embodiment of the invention's local oscillation generator. Further shown in FIG. 4, discrete components 410 and 412 are mounted on PCB 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, in the invention's local oscillation generator, such as local oscillation generator 200 in FIG. 2, different output frequencies can be selected by enabling a power path in a corresponding transconductance stage. In one embodiment, the power path in a particular transconductance stage can be enabled by turning on a corresponding switch, e.g. transistor 326 or 328, which is placed in the ground path of the transconductance stage. By utilizing switches in power paths to enable a corresponding transconductance stage in a mixer to select a desired divider output signal, e.g. DIV SIG 311 or DIV SIG 313, the invention's local oscillation generator utilizes DC power, and not signal power, for selecting a particular divider output to be combined with a local oscillation generator input signal to achieve a desired frequency at the output of the local oscillation generator. In contrast, a conventional local oscillation generator, such as conventional local oscillation generator 100 in FIG. 1, selects divider output signals by using switches connected in series with signal paths of divider output signals. As a result, conventional local oscillation generators result in signal power loss and also undesirably increase overall power consumption.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a local oscillation generator and mixer having reduced signal power consumption have been described.

The invention claimed is:

1. A local oscillation generator comprising a mixing stage for receiving a primary frequency and one of a plurality of related frequencies, said local oscillation generator comprising:
   a first transconductance stage providing a first of said plurality of related frequencies to said mixing stage when a first switch selectably enables a first power path in said first transconductance stage;
   a second transconductance stage providing a second of said plurality of related frequencies to said mixing stage when a second switch selectably enables a second power path in said second transconductance stage;
   wherein a signal path of said first of said plurality of related frequencies does not pass through said first switch and a signal path of said second of said plurality of related frequencies does not pass through said second switch.

2. The local oscillation generator of claim 1 further comprising a plurality of dividers, wherein an output of a first of said plurality of dividers provides said first of said plurality of related frequencies to an input of said first transconductance stage.

3. The local oscillation generator of claim 2 wherein an output of a second of said plurality of dividers provides said second of said plurality of related frequencies to an input of said second transconductance stage.

4. A semiconductor die comprising the local oscillation generator of claim 1.

5. The local oscillation generator of claim 1 wherein said first transconductance stage comprises at least one FET, wherein said at least one FET is selectably coupled to ground by said first switch to enable said first power path.

6. The local oscillation generator of claim 1 wherein each of said plurality of related frequencies is derived from dividing said primary frequency.

7. A local oscillation generator comprising a mixing stage for receiving a primary frequency and first and second divided frequencies, said local oscillation generator comprising:
   a first transconductance stage receiving said first divided frequency from a first divider and selectably providing said first divided frequency to said mixing stage when a first switch selectably enables a first power path in said first transconductance stage;
   a second transconductance stage receiving said second divided frequency from a second divider and selectably providing said second divided frequency to said mixing stage when a second switch selectably enables a second power path in said second transconductance stage;
   wherein signal paths of said first and second divided frequencies do not pass through said first and second switches.

8. A semiconductor die comprising the local oscillation generator of claim 7.

9. The local oscillation generator of claim 7 wherein said first transconductance stage comprises at least one FET selectably coupled to ground by said first switch to enable said first power path.

10. The local oscillation generator of claim 7 wherein said second transconductance stage comprises at least one FET selectably coupled to ground by said second switch to enable said second power path.

11. The local oscillation generator of claim 7 wherein said first divider is coupled in series with said second divider, and wherein said primary frequency is coupled to an input of said first divider.

12. The local oscillation generator of claim 7 wherein said first switch and said second switch each comprise at least one FET.

13. A semiconductor die comprising a local oscillation generator, said local oscillation generator comprising a mixing stage for receiving a primary frequency and one of a plurality of related frequencies, said local oscillation generator comprising:
- a first transconductance stage providing a first of said plurality of related frequencies to said mixing stage when a first switch selectably enables a first power path for said first transconductance stage;
- a second transconductance stage providing a second of said plurality of related frequencies to said mixing stage when a second switch selectably enables a second power path for said second transconductance stage;
- wherein a signal path of said first of said plurality of related frequencies does not pass through said first switch and a signal path of said second of said plurality of related frequencies does not pass through said second switch.

14. The semiconductor die of claim 13 wherein said local oscillation generator further comprises a plurality of dividers, wherein an output of a first of said plurality of dividers provides said first of said plurality of related frequencies to an input of said first transconductance stage.

15. The semiconductor die of claim 14 wherein an output of a second of said plurality of dividers provides said second of said plurality of related frequencies to an input of said second transconductance stage.

16. The semiconductor die of claim 13 wherein said first transconductance stage comprises at least one FET, wherein said at least one FET is selectably coupled to ground by said first switch to enable said first power path.

17. The semiconductor die of claim 13 wherein each of said plurality of related frequencies is derived from dividing said primary frequency.

18. The semiconductor die of claim 13 wherein said semiconductor die is utilized in an electronic system selected from the group consisting of a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, and a digitally-controlled medical equipment.

* * * * *